(12) United States Patent
Otaka et al.

(10) Patent No.: US 8,958,767 B2
(45) Date of Patent: Feb. 17, 2015

(54) RADIO APPARATUS

(75) Inventors: Shoji Otaka, Kanagawa-ken (JP);
Takafumi Yamaji, Kanagawa-ken (JP);
Tsutomu Sugawara, Tokyo (JP);
Yasuhiko Tanabe, Tokyo (JP);
Masahiro Hosoya, Tokyo (JP); Hiroki Sakurai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 349 days.

(21) Appl. No.: 13/422,636

(22) Filed: Mar. 16, 2012

(65) Prior Publication Data

US 2012/0208483 A1    Aug. 16, 2012

Related U.S. Application Data

(63) Continuation of application No. PCT/JP2009/007127, filed on Dec. 22, 2009.

(51) Int. Cl.
*H04B 1/06*     (2006.01)
*H04W 52/02*    (2009.01)
(Continued)

(52) U.S. Cl.
CPC ......... *H04W 52/0274* (2013.01); *H03L 7/0802* (2013.01); *H03L 7/1976* (2013.01);
(Continued)

(58) Field of Classification Search
CPC .... H04B 1/71637; H04B 1/30; H04B 1/7097; H04B 1/7101; H04B 7/022; H04W 28/04; H04W 28/06; H04W 68/00; H04W 52/0229; H04W 52/0274; H04W 52/52; H04W 84/042; H04W 88/02; H04K 1/10
USPC ................................................ 455/127–355
See application file for complete search history.

(56) References Cited

U.S. PATENT DOCUMENTS 4,596,046 A * 6/1986 Richardson et al. .......... 455/260
5,018,015 A * 5/1991 Sunada et al. ................ 348/725
(Continued)

FOREIGN PATENT DOCUMENTS

JP     2003-046353 A    2/2003
JP     2003-087180 A    3/2003
(Continued)

OTHER PUBLICATIONS

U.S. Appl. No. 13/421,391, filed Mar. 15, 2012: First Named Inventor: Shoji Otaka: Title: "Radio Apparatus".
(Continued)

*Primary Examiner* — Lana N Le
(74) *Attorney, Agent, or Firm* — Holtz, Holtz, Goodman & Chick PC (57) ABSTRACT

A radio apparatus includes an antenna; an amplifier that amplifies a radio signal, received via the antenna; a first mixer that frequency converts the amplified radio signal to generate a first analog signal; a first A/D converter that converts the first analog signal to generate a first digital signal; a second mixer that frequency converts the amplified signal to generate a second analog signal; a second A/D converter means that converts the second analog signal to generate a second digital signal; a demodulator means that demodulates the first and second digital signals to generate a demodulated signal; a detector that detects a preamble from the first digital signal; and a control means that halts the second mixer and second A/D converter during the wait for the radio signal and that activates the second mixer and second A/D converter when the detector detects the preamble.

8 Claims, 8 Drawing Sheets

(51) Int. Cl.
*H03L 7/08* (2006.01)
*H03L 7/197* (2006.01)
*H04L 25/02* (2006.01)
*H04L 27/38* (2006.01)

(52) U.S. Cl.
CPC ............ *H04L25/0292* (2013.01); *H04L 27/38* (2013.01); *H04L 27/3818* (2013.01); *H04W 52/0229* (2013.01); *H03L 2207/50* (2013.01)
USPC .................................... 455/232.1; 455/127.1

(56) References Cited

U.S. PATENT DOCUMENTS

| | | | |
|---|---|---|---|
| 6,223,061 B1 * | 4/2001 | Dacus et al. | 455/574 |
| 6,549,078 B1 * | 4/2003 | Sridharan et al. | 375/376 |
| 7,460,842 B2 * | 12/2008 | Black et al. | 455/127.1 |
| 7,606,329 B2 | 10/2009 | Yamauchi | |
| 2003/0027538 A1 | 2/2003 | Masumoto et al. | |
| 2005/0185737 A1 | 8/2005 | Yamauchi | |
| 2008/0024208 A1 | 1/2008 | Oishi et al. | |
| 2009/0052417 A1 | 2/2009 | Sakamoto et al. | |
| 2009/0067356 A1 | 3/2009 | Sakamoto et al. | |
| 2009/0310524 A1 * | 12/2009 | Katsube et al. | 375/322 |
| 2010/0056054 A1 | 3/2010 | Yamato et al. | |
| 2010/0164629 A1 * | 7/2010 | Behzad et al. | 330/296 |

FOREIGN PATENT DOCUMENTS

| | | |
|---|---|---|
| JP | 2004-320377 A | 11/2004 |
| JP | 2005-229570 A | 8/2005 |
| JP | 2008-061232 A | 3/2008 |
| JP | 2008-288879 A | 11/2008 |

OTHER PUBLICATIONS

M. Krstic et al; Optimized Low-Power Synchronizer Design for the IEEE 802.11a Standard; 2003; IEEE; pp. 11-333 to 11-336.
International Search Report dated Apr. 6, 2010 (in English) in counterpart International Application No. PCT/JP2009/007127.
International Preliminary Report on Patentability (IPRP) and Written Opinion dated Jul. 5, 2012 (in English) issued in counterpart International Application No. PCT/JP2009/007127.

* cited by examiner

RADIO APPARATUS

CROSS REFERENCE TO RELATED APPLICATIONS

This application is a continuation of International Application No. PCT/JP2009/007127 filed Dec. 22, 2009, the entire contents of which are incorporated herein by reference.

FIELD

Embodiments described herein relate to a radio apparatus.

BACKGROUND

A radio apparatus that performs communication using a random access method, such as a wireless LAN, is required to keep awaiting a signal, since it is not known when the signal is transmitted. In general, a period of time for awaiting a signal is longer than a period of time for receiving a signal. In order to reduce power consumption of the whole radio apparatus, it is important to reduce power consumption during standby time.

As a method for reducing power consumption of the radio apparatus, for example, a method for improving a configuration of a synchronizing circuit in a digital demodulator is known (see Milos Krstic, et. al., "Optimized low-power synchronizer design for the IEEE 802.11a standard," ICASSP 2003 pp. 333-336, for example).

However, the method described in the Non-Patent Document 1 has a problem such that power consumption of the analog demodulator in a receiving unit cannot be reduced while power consumption of the digital demodulator in the radio apparatus can be reduced.

The analog demodulator consumes as much power during standby time as when receiving a signal. Therefore, it is desired to reduce power consumption when the analog demodulator is in standby state to attain lower power consumption of the radio apparatus.

Accordingly, a radio apparatus capable of reducing power consumption during standby time is required.

DETAILED DESCRIPTION

The following will describe each of the embodiments of the present invention.

A radio apparatus according to an embodiment of the present invention comprises: an antenna; an amplifying means that amplifies a radio signal, received via the antenna, to generate an amplified signal; a first mixer that frequency-converts the amplified signal to generate a first analog signal; a first A/D converting means that converts the first analog signal to generate a first digital signal; a second mixer that frequency converts the amplified signal to generate a second analog signal; a second A/D converting means that converts the second analog signal to generate a second digital signal; a demodulating means that demodulates the first and second digital signals to generate a demodulated signal; a detecting means that detects a preamble from the first digital signal; and a control means that halts the second mixer and second A/D converting means during the wait for the radio signal and that activates the second mixer and second A/D converting means when the detecting means detects the preamble.

According to a radio apparatus of the present invention, reduction of power consumption during standby time can be achieved.

Embodiment 1

Figure 1:
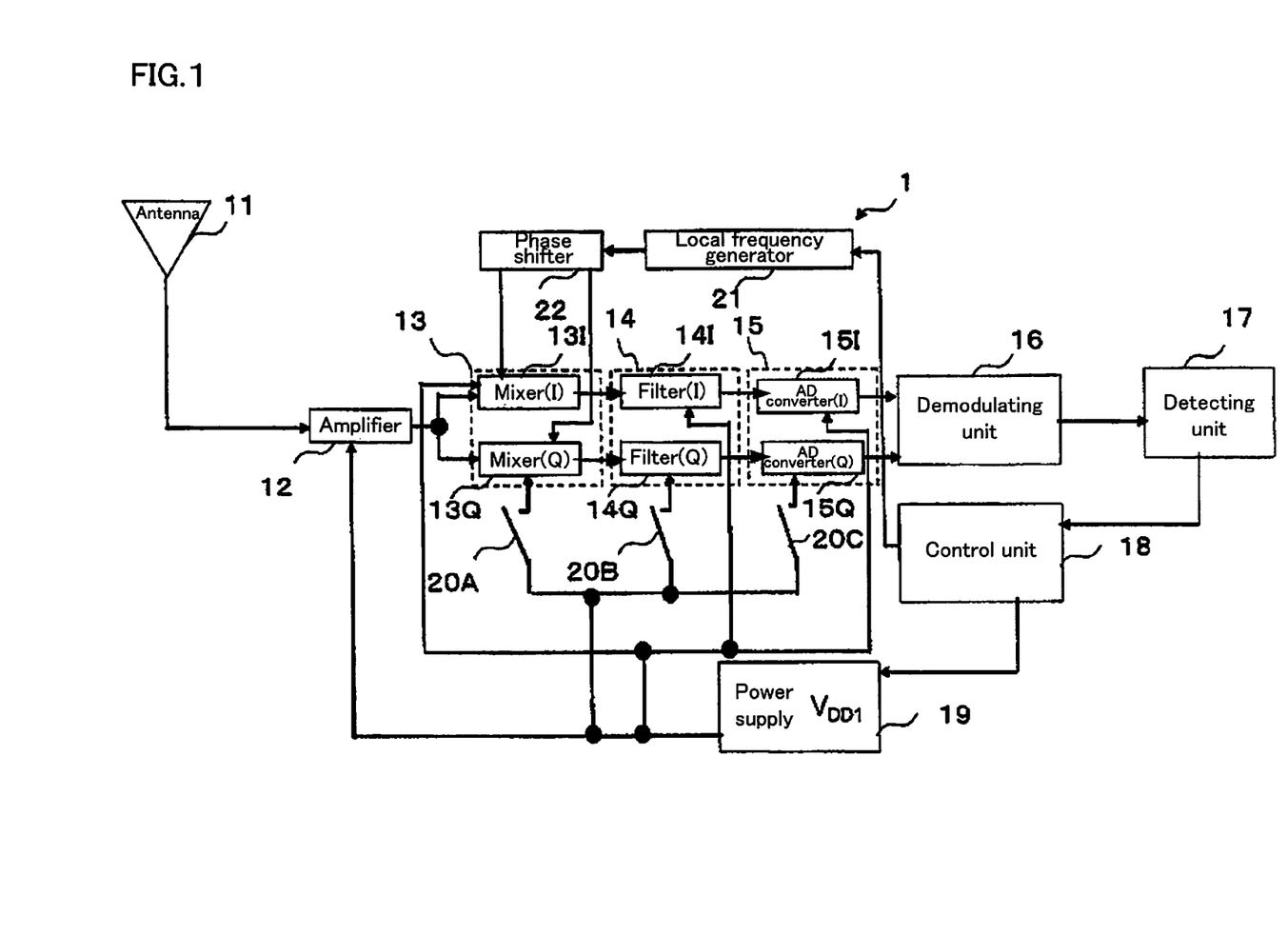
FIG. 1 is a block diagram showing a radio apparatus 1 according to an embodiment 1.

FIG. 1 is a block diagram showing a radio apparatus 1 according to an embodiment 1 of the present invention. The radio apparatus 1 comprises an antenna 11 that receives a radio signal, an amplifier that amplifies the radio signal to generate an amplified signal, a first mixer 13I that frequency-converts the amplified signal to generate a first analog signal, a second mixer 13I that frequency-converts the amplified signal to generate a second analog signal, a first A/D converter 15I that converts the first analog signal input via a first filter 14I to a first digital signal, a second A/D converter 15Q that converts the second analog signal input via a second filter 14Q to the first digital signal, a demodulator 16 that demodulates the first and second digital signals to generate a demodulated signal, and a detecting unit 17 that detects a preamble from the first analog signal.

In addition, the radio apparatus 1 comprises a control unit 18 that halts the second mixer 13Q and the second A/D converter 15Q during the wait for a radio signal and activates the second mixer 13Q and the second A/D converter 15Q when the detecting unit 17 detects a preamble, and a power supply (VDD1) 19 that supplies power to each unit. The control unit 18 will be described in detail later.

Figure 2:
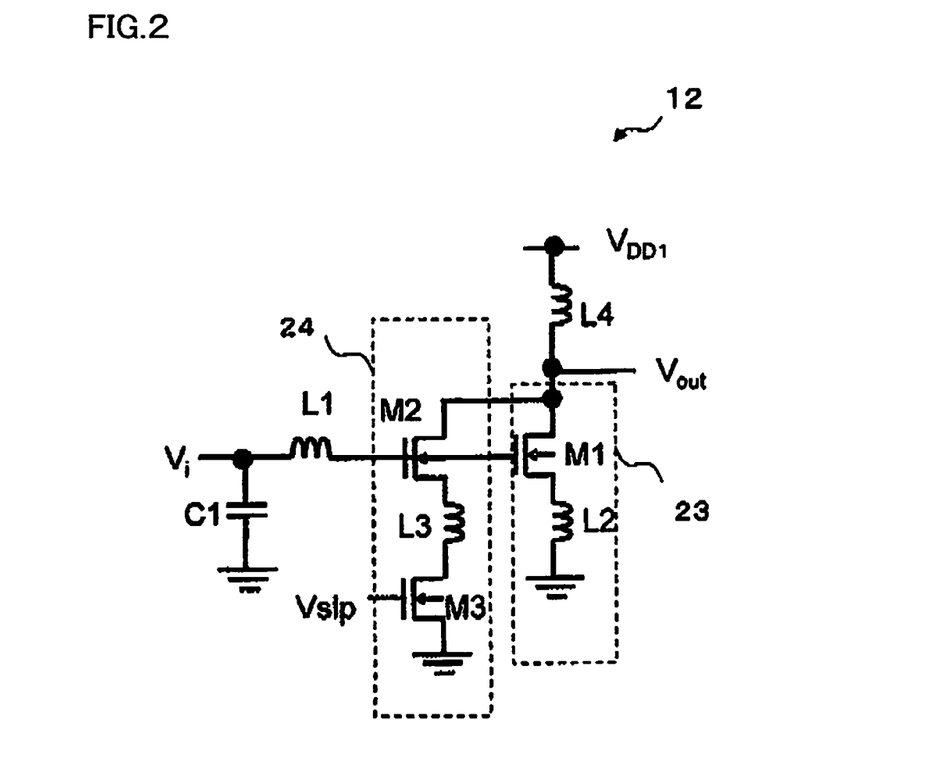
FIG. 2 is a diagram showing the details of an amplifier 12 of the radio apparatus 1.

The following will describe the details of each unit. FIG. 2 shows the amplifier 12 in detail.

The amplifier 12 has a first transconductance unit 23 comprising a first transistor M1 and an inductor L2, and a second transconductance unit 24 connected in parallel with the first transconductance unit 23 and comprising a second transistor M2, a third transistor M3 and an inductor L3.

The amplifier 12 has an input terminal Vi to which a radio signal is input, a capacitor C1 having one end connected to the input terminal Vi and the other end grounded, and an inductor L1 having one end connected to the input terminal Vi and the other end connected to the first transconductance unit 23.

The first transconductance unit 23 has the first transistor M1, in which a gate terminal is connected to the input terminal Vi via the inductor L1, a drain terminal is connected to an output terminal Vout, and a source terminal is connected to one end of the inductor L2, and the inductor L2 having the other end grounded. In other words, the first transconductance unit 23 has the first transistor M1 and the inductor L2 connected in series to the first transistor M1.

The second transconductance unit 24 has the second transistor M2, in which a gate terminal is connected to the input terminal Vi via the inductor L1, a drain terminal is connected to the output terminal Vout, and a source terminal is connected to one end of the inductor L3, the inductor L3 having the other end connected to a drain terminal of a third transistor M3, and the third transistor M3, in which a control voltage Vslp is applied to a gate terminal and a source terminal is grounded. Thus, the second transistor M2, the inductor L3 and the third transistor M3 are connected in series.

The amplifier 12 has an inductor L4 having one end connected to VDD1 and the other end connected to the output terminal Vout. Power-supply voltage is supplied to the VDD1 from the power supply 19. The radio signal input from the input terminal Vin is amplified by the amplifier 12 and output as an amplified signal from the output terminal Vout.

The amplifier 12 activates the transconductance unit 23 and halts the second transconductance unit 24 during the wait for a radio signal at the direction of the control unit 18. The amplifier 12 activates the second transconductance unit 24 and amplifies the radio signal at the first and second transconductance units 23 and 24 to generate an amplified signal at the direction of the control unit 18 when the detecting unit 17 detects a preamble. Specifically, when halting the second transconductance unit 24, the control unit 18 applies the control voltage Vslp to the gate terminal of the third transistor M3 to prevent a current from flowing in the second transconductance unit 24. On the other hand, when activating the second transconductance unit 24, the control unit 18 changes the voltage value of the control voltage Vlsp to allow the current to flow in the second transconductance unit 24.

When the total amount of current flowing in the amplifier 12 changes, a noise figure NF also fluctuates. In order to reduce the fluctuation of the noise figure NF, the current flowing in the amplifier should be prevented from reducing by more than a certain amount even when the second transconductance unit 24 is halted. The reduction of current flowing in the amplifier 12 after halting the second transconductance unit 24 is desirable to be approximately 1/10 compared to the amount before halting the second transconductance unit 24. To achieve this, 10 times amount of the current flowing in the second transistor M2 should flow in the first transistor M1. Specifically, the proportion of channel width of the first transistor M1 to that of the second transistor M2 should be M1:M2=10:1.

Referring back to FIG. 1, the first mixer 13I converts the frequency of an amplified signal output by the amplifier 12 using a local oscillation signal generated by a local frequency generator 21 to generate a first analog signal. The second mixer 13Q converts the frequency of the signal output by amplifier 12 using a signal, which is obtained by shifting a phase of the local oscillation signal by 90 degrees, to generate a second analog signal orthogonal to the first analog signal. The first and the second analog signals are IF signals including Zero-IF. The first mixer 13I and the second mixer 13Q are together referred to as a quadrature demodulator 13. The control unit 18 halts the second mixer 13Q and activate the first mixer 13I during standby time. When the detecting unit 17 detects a preamble, the control unit 18 activates the second mixer 13Q.

The first filter 14I suppresses the signal outside a desired band included in the first analog signal and output the first analog signal. The second filter 14Q suppresses the signal outside a desired band included in the second analog signal and output the second analog signal. The first filter 14I and the second filter 14Q are together referred to as a filter 14. The second filter 14Q halts during standby time and operates when the detecting unit 17 detects a preamble.

The first AD converter 15I converts the first analog signal input via the first filter 14I to a digital signal to generate a first digital signal. The second AD converter 15Q converts the second analog signal input via the second filter 14Q to a digital signal to generate a second digital signal. The first AD converter 15I and the second AD converter 15Q are together referred to as an AD converter 15.

The first mixer 13I, the first filter 14I and the first AD converter 15I are together referred to as an I system receiving circuit. The second mixer 13Q, the second filter 14Q and the second AD converter 15Q are together referred to as a Q system receiving circuit.

During standby time, the demodulating unit 16 receives a first digital signal from the first AD converter 15I and outputs the first digital signal to the detecting unit 17. It demodulates the first and second digital signals to generate a demodulated signal when the detecting unit 17 detects a preamble. The demodulated signal is output to the upper layer that is not shown. The demodulating unit 16 determines whether it is during standby time or not, based on the direction of the control unit 18.

The detecting unit 17 detects a preamble from the first digital signal input from the demodulating unit 16.

Figure 3:
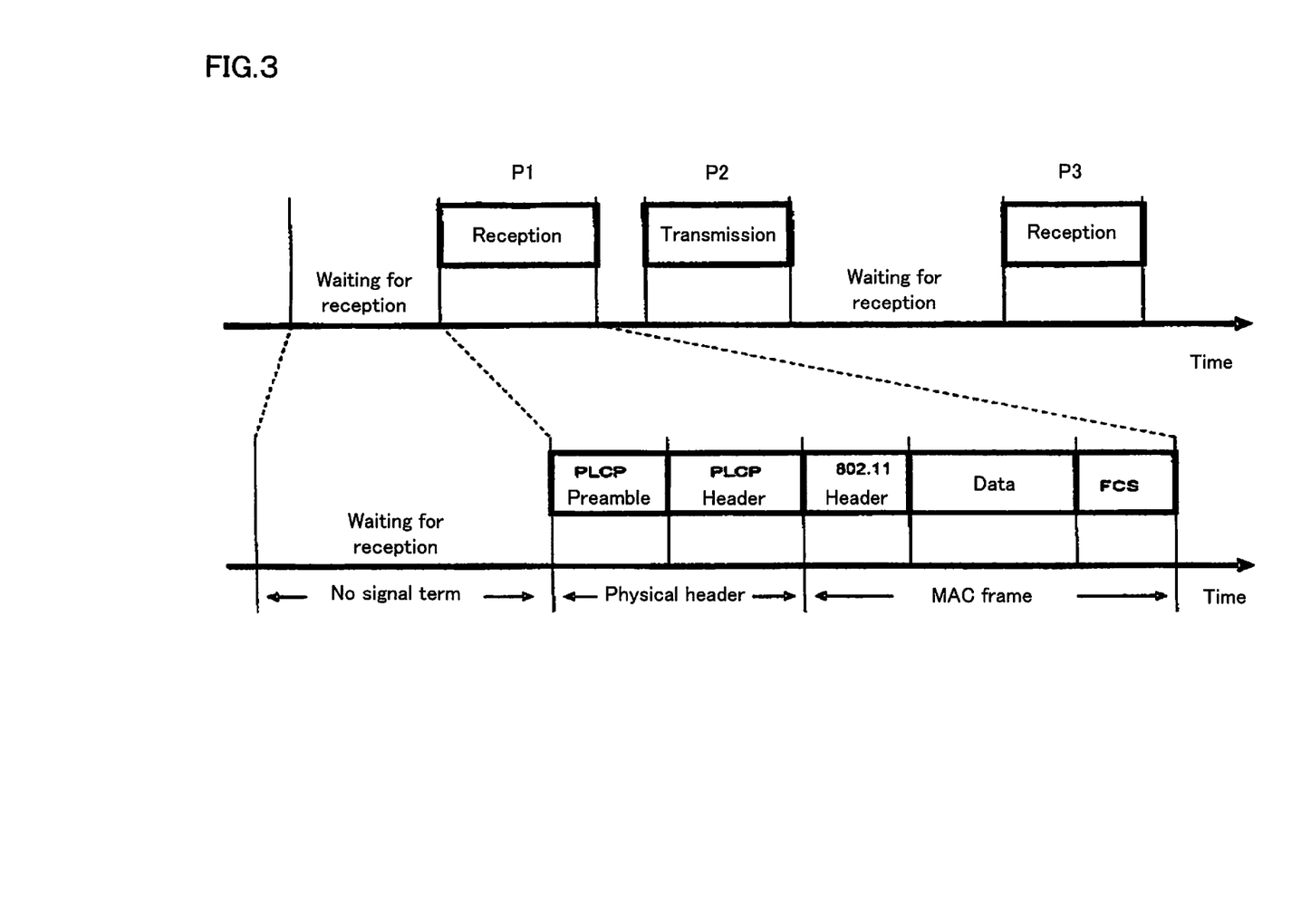
FIG. 3 is a diagram showing a radio communication performed by the radio apparatus 1.

Referring now to FIG. 3, a format of a radio signal will be described. As shown in FIG. 3, the radio apparatus 1 according to this embodiment transmits and receives radio signals in terms of packet.

FIG. 3 shows a configuration of a packet P1 that the radio apparatus 1 receives. A packet P3 has the same configuration. A packet P2 is a packet that the radio apparatus 1 transmits. Since transmission/reception packets have the same configuration for a packet communication such as a wireless LAN, they are described as having the same configuration. However, the transmission packet P2 and the reception packets P1 and P3 may have different configurations.

The packet P1 comprises a physical header and a MAC frame. The physical header comprises a PLCP (physical layer convergence protocol) preamble and a PLCP header. The MAC frame comprises an 802.11 header, a data and an FCS (Frame Check Sequence).

As shown in FIG. 3, the PLCP preamble of the packet P1 arrives from a communication sender. The PLCP preamble is a training signal constituted by a known sequence with 12 sub carriers. The radio apparatus 1 receives the PLCP preamble, thereby performing packet detection, an AGC (Automatic Gain Control) and the like.

The radio apparatus 1 detects a PLCP preamble included in a packet, thereby detecting a radio signal. The packet is converted into the radio signal and transmitted. The radio apparatus 1 detects a signal sequence corresponding to the PLCP preamble from the radio signal, thereby detecting reception of the radio signal.

In other words, in the sections corresponding to the standby time and the PLCP preamble in FIG. 3, the radio apparatus 1 activates the I system receiving circuit. The first mixer 13I performs frequency conversion on the radio signal corresponding to the PLCP preamble to generate a first analog signal. The first filter 14I suppresses the signal outside a desired band of the first analog signal. The first AD converter 15I generates a first digital signal from the first analog signal input via the first filter. In the sections corresponding to the PLCP header and the MAC frame, the radio apparatus 1 activates the quadrature demodulator 13, the filter 14 and the AD converter 15.

The detecting unit 17 detects a PLCP preamble from a first digital signal input from the demodulating unit 16. Specifically, since the section corresponding to the preamble of the radio signal is a known signal sequence, the detecting unit 17 detects whether the first digital signal includes a signal sequence identical with a preliminary stored signal sequence.

When the first digital signal includes the preliminary stored signal sequence, the detecting unit 15 notifies the control unit 18 of a detection signal indicating that the preamble is detected. In FIG. 1, although the detecting unit 17 receives the first digital signal from the demodulating unit 16, it may receive the first digital signal from the first AD converter 15I.

The power supply 19 supplies power-supply voltage to each unit of the radio apparatus 1. FIG. 1 shows an example of the power supply 19 supplying power-supply voltage to the amplifier 12, the quadrature demodulator 13, the filter 14 and the AD converter 15. In FIG. 1, the power supply 19 supplies power-supply voltage to the second mixer 13Q via a switch 20A. The power supply 19 supplies power-supply voltage to the second filter 14Q via a switch 20B. The power supply supplies power-supply voltage to the second AD converter 15Q via a switch 20C.

Next, with reference to FIG. 4, the local frequency generator 21 will be described. The local frequency generator 21 has a VCO (voltage-controlled oscillator) 29 that generates a local oscillation signal based on a control signal, a frequency divider 30 that frequency-divides the local oscillation signal generated by the VCO 29 to generate a frequency divided signal, a reference signal generator 25 that generates a reference signal, a phase comparator 26 that compares the reference signal and the frequency divided signal, a filter 27 that filters a comparison result of the phase comparator 26 to generate the control signal, a signal holder 28 that holds the control signal generated by the filter 27, and a switch 31 that supplies either the control signal generated by the filter 27 or the control signal held by the signal holder 28 to the VCO 29.

The control unit 18 controls the switch 31 to supply the VCO 29 with the control signal held by the signal holder 28 during standby time, and with the control signal generated by the filter 27 when receiving a radio signal.

In addition, the local frequency generator 21 has an ON/OFF switch 32 provided between the VCO 29 and the frequency divider 30. The ON/OFF switch 32 connects or disconnects the VCO 29 and the frequency divider 30 at the direction of the control unit 16. The control unit 16 controls the ON/OFF switch 32 to disconnect the VCO 29 from the frequency divider 30 when a first receiver 122 is operative. The control unit 18 also controls the ON/OFF switch 32 so that the VCO 29 and the frequency divider 30 are connected when receiving the radio signal.

When detecting the radio signal, EVM (Error Vector Magnitude) would not be particularly problematic. It should be determined whether the radio signal is present. Accordingly, when detecting a preamble of the radio signal, the accuracy of frequency of the local frequency generator may be any degree of accuracy with which adjacent channels are not incorporated into the desired wave band. A frequency error of several hundred kHz is acceptable in regard to a wireless LAN.

Accordingly, during standby time when the radio signal should be detected, the control unit 18 controls the switch 31 to provide the VCO 29 with the control signal held by the signal holder 28. This enables the VCO to output the local oscillation signal even when deactivating a phase lock loop (a loop comprising the frequency divider 30, the phase comparator 26, the filter 27 and the VCO 29) of the local frequency generator 21. Thus, the control unit controls the ON/OFF switch 32 to open the phase lock loop during standby time, allowing the power consumption of the local frequency generator 21 to be reduced.

Opening the phase lock loop may cause a frequency drift. However, closing the loop at regular intervals even in the period of the phase lock loop being open enables the signal holder 28 to hold the control signal that can obtain a desired oscillation frequency. The frequency drift can be avoided as well.

Referring back to FIG. 1, a local oscillation signal generated by the local frequency generator 21 is input to a phase shifter 22. The phase shifter 22 inputs signals, the phases of which are different by degrees, to the first and second mixers 13I and 13Q, respectively. In FIG. 1, the phase shifter 22 inputs the local oscillation signal to the first mixer 13I, and inputs a signal, which is obtained by shifting a phase of the local oscillation signal by 90 degrees, to the second mixer 13Q.

The control unit 18 controls each unit so that a part of the radio apparatus 1 halts during standby time and each part of the radio apparatus 1 operates when receiving a radio signal.

First, the following will describe the radio signal reception time. When the control unit 18 receives a detecting signal from the detecting unit 17, it determines that a radio signal is received (the radio signal reception time) and activates each part of the radio apparatus 1. The control unit 18 changes the control voltage Vslp to activate the second transconductance unit 24 in the amplifier 12. The control unit 18 controls the switches 20A-20C, thereby controlling so that power-supply voltage is supplied to the second mixer 13Q, the second filter 14Q and the second AD converter 15Q. In this manner, the control unit 18 activates each unit, allowing the first and second digital signals to be input to the demodulating unit 16. The demodulating unit 16 demodulates the first and second digital signals to generate a demodulated signal. When the demodulation of the radio signal is completed, the demodulating unit 16 notifies the control unit 18 of a completion signal indicating that the demodulation is completed. The upper layer may notify the control unit 18 of this completion signal. For example, the upper layer may notify the control unit 18 of the completion signal after it confirms that there is no error in the demodulated signal and determines to end the receiving operation.

When receiving the completion signal, the control unit 18 transits from the radio signal reception time to the standby time. The control unit 18 changes the control voltage Vslp to halt the second transconductance unit 24 in the amplifier 12. The control unit 18 controls the switches 20A-20C to halt supplies of power-supply voltage to the Q system receiving circuit. In this manner, the control unit 18 halts the second transconductance unit 24 and the Q system receiving circuit during standby time. In addition, the demodulating unit 16 may activate only the circuits required to output the first digital signal to the detecting unit 17 and halt circuits required to generate the demodulated signal during standby time.

As described above, the power consumption of the radio apparatus 1 can be reduced during standby time by halting the second transconductance unit 24 and the Q system receiving circuit during the wait for a radio signal and activating the second transconductance unit and the Q system receiving circuit when the detecting unit 17 detects a preamble.

Although the Q system receiving circuit is halted in this embodiment, the I system receiving circuit may be halted. During standby time, either I or Q system waits for a radio signal, allowing the standby energy to be reduced during standby time.

Modified Embodiment 1

Next, with reference to FIG. 5, a modified embodiment 1 of this embodiment will be described. In the radio apparatus 1 in FIG. 1, the control unit 18 controls the switches 20A-C to halt/activate the Q system receiving circuit. In this modified embodiment, however, the control unit 18 controls current sources held by the second mixer 13Q, the second filter 14Q and the second AD converter 15Q to halt/activate the Q system receiving circuit.

Figure 5:
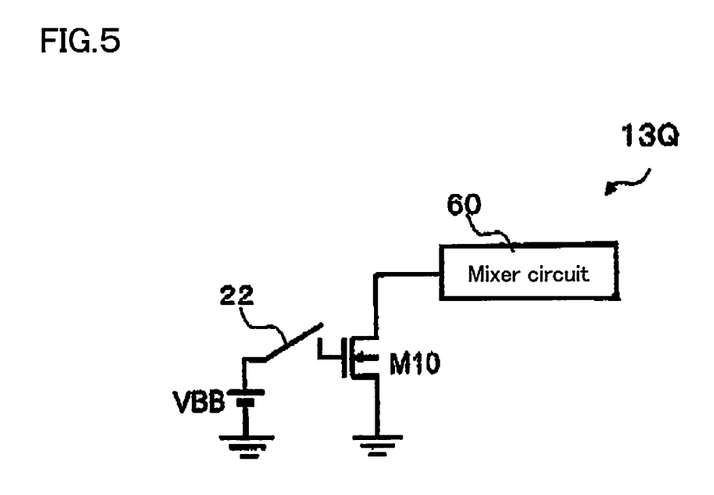
FIG. 5 is a diagram showing a second mixer of a modified embodiment 1.

FIG. 5 shows the second mixer 13Q according to this modified embodiment. The following will describe an example of controlling the current source in regard to the second mixer 13Q. However, the current sources held by the second filter 14Q and the second AD converter 15Q can be controlled as well.

In FIG. 5, the second mixer 13Q has a mixer circuit 60, a current source M10 connected to the mixer circuit, and a switch 22 provided between the current source and the power supply that supplies a voltage VBB to the current source. In the example of FIG. 5, the current source M10 is constituted by a transistor. The voltage VBB is applied to the gate terminal of the transistor to generate a reference current.

The control unit 18 turns the switch 22 OFF during standby time, thereby controlling the current source M10 not to generate the reference current. When receiving a radio signal, the control unit 18 turns the switch 22ON, thereby controlling the current source M10 to generate the reference current.

When requiring rapid activation of the second mixer 13Q, the voltage VBB may be decreased to decrease the reference current generated by the current source M10, instead of completely halting the current source M10. In this case, for example, a power supply that can change a value of the voltage VBB may be prepared, instead of the switch 22. When receiving a radio signal, the power supply supplies the voltage VBB, the voltage value of which is VBB. During standby time, it supplies voltage, the voltage value of which is VBB' (VBB'<VBB).

This enables reduction of the power consumption during the wait for a radio signal as well as rapid switching to activate/halt the second mixer 13Q.

Modified Embodiment 2

Figure 6:
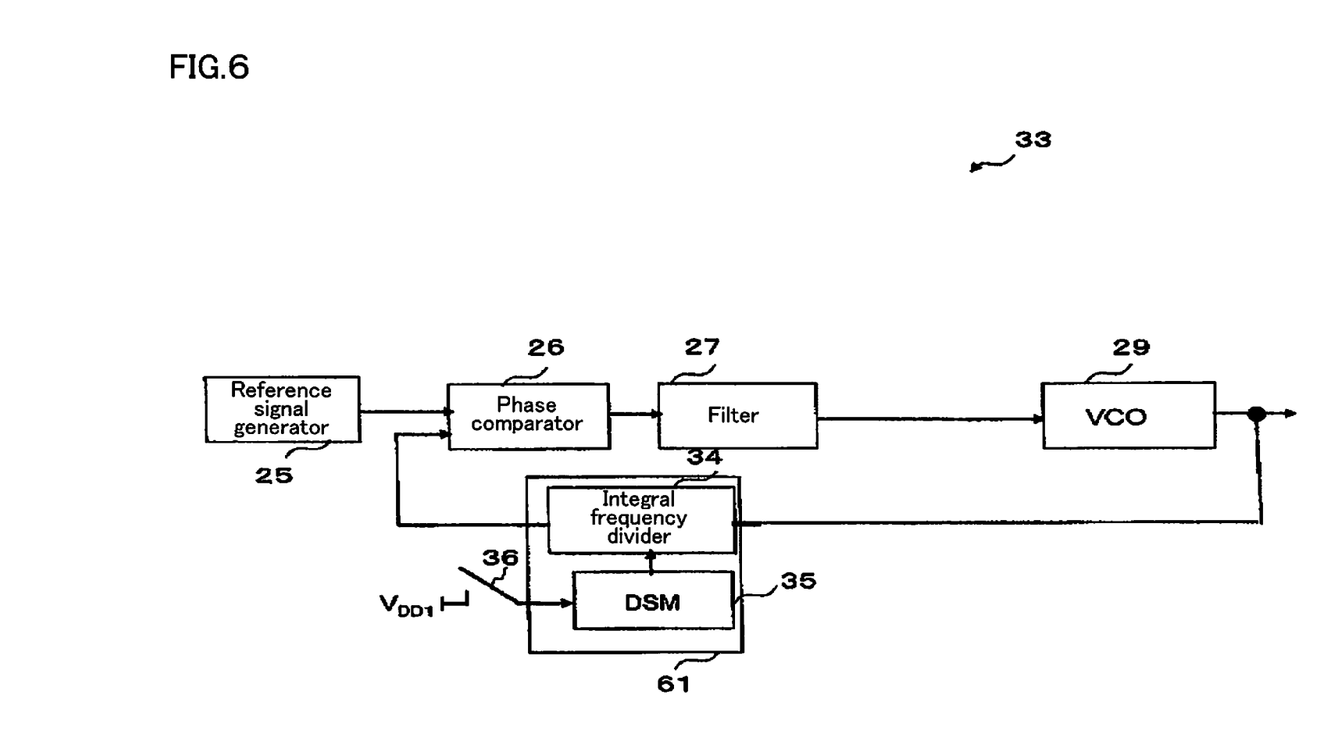
FIG. 6 is a diagram showing another embodiment of a local frequency generator of the radio apparatus 1.

FIG. 6 is a diagram showing a modified embodiment of the local frequency generator 21 of the radio apparatus 1. The local frequency generator 33 shown in FIG. 6 has a frequency divider 61 instead of the frequency divider 30 in the local frequency generator 21 shown in FIG. 4. In addition, the local frequency generator 33 does not have the signal holder 28 and the switch 31. The frequency divider 61 in the local frequency generator 33 has an integral frequency divider 34 and a DSM (Delta-Sigma Modulator) 35. The frequency divider 61 frequency-divides a local oscillation signals integrally or fractionally. That is, the local frequency generator 33 switches an integral frequency-dividing analog phase lock loop and a fractional frequency-dividing phase lock loop to generate the local oscillation signal. The following will describe the different parts of the local frequency generator 33 from the local frequency generator 21. Explanations of constituent elements having the same reference numerals as those in the local frequency generator 21 are omitted as they have the same functions.

The local frequency generator 33 has, instead of the frequency divider 30 of the local frequency generator 21, the integral frequency divider 34, the DSM 35 applying ΔΣ modulation to the integral frequency divider 34 and a switch 36 controlling ON and OFF of the DSM 35. The switch 36 performs ON/OFF at the direction of the control unit 18 to switch whether to supply power-supply voltage to the DSM 35 from the power supply 19 or not.

When receiving a radio signal, the control unit 18 turns the switch 36ON to supply power-supply voltage to the DSM 35, thereby activating the DSM 35 to apply the ΔΣ modulation to the integral frequency divider 34. The DSM 35 applies the ΔΣ modulation to the integral frequency divider 34, allowing the frequency divider 61 to frequency-divides a local oscillation signal fractionally (The fractional frequency-dividing phase lock loop is operative).

During standby time, the control unit 18 turns the switch 36 OFF to halt supplying power-supply voltage to the DSM 35, thereby halting the DSM 35 not to apply the ΔΣ modulation to the integral frequency divider 34. Because the ΔΣ modulation is not applied to the integral frequency divider 34, the frequency divider 61 frequency-divides a local oscillation signal integrally (The integral analog phase lock loop is operative).

When the fractional frequency-dividing phase lock loop is operative, a resolution of the frequency is higher while the power consumption is larger than when the integral analog phase lock loop is operative. A radio signal is only required to be detected during standby time, and the frequency accuracy of a local oscillation signal may be lower than when receiving the radio signal. In this modified embodiment, the local frequency generator 33 performs fractional frequency dividing, when receiving a radio signal, to generate a local oscillation signal with high frequency accuracy. It also performs integral frequency dividing during standby time to generate a local oscillation signal with lower frequency accuracy than when receiving a radio signal.

Performing high accurate fractional frequency dividing during reception and performing integral frequency dividing with less power consumption during standby time improves the frequency accuracy of the local frequency generator 33 during reception time and reduce the power consumption during standby time.

Modified Embodiment 3

Figure 7:
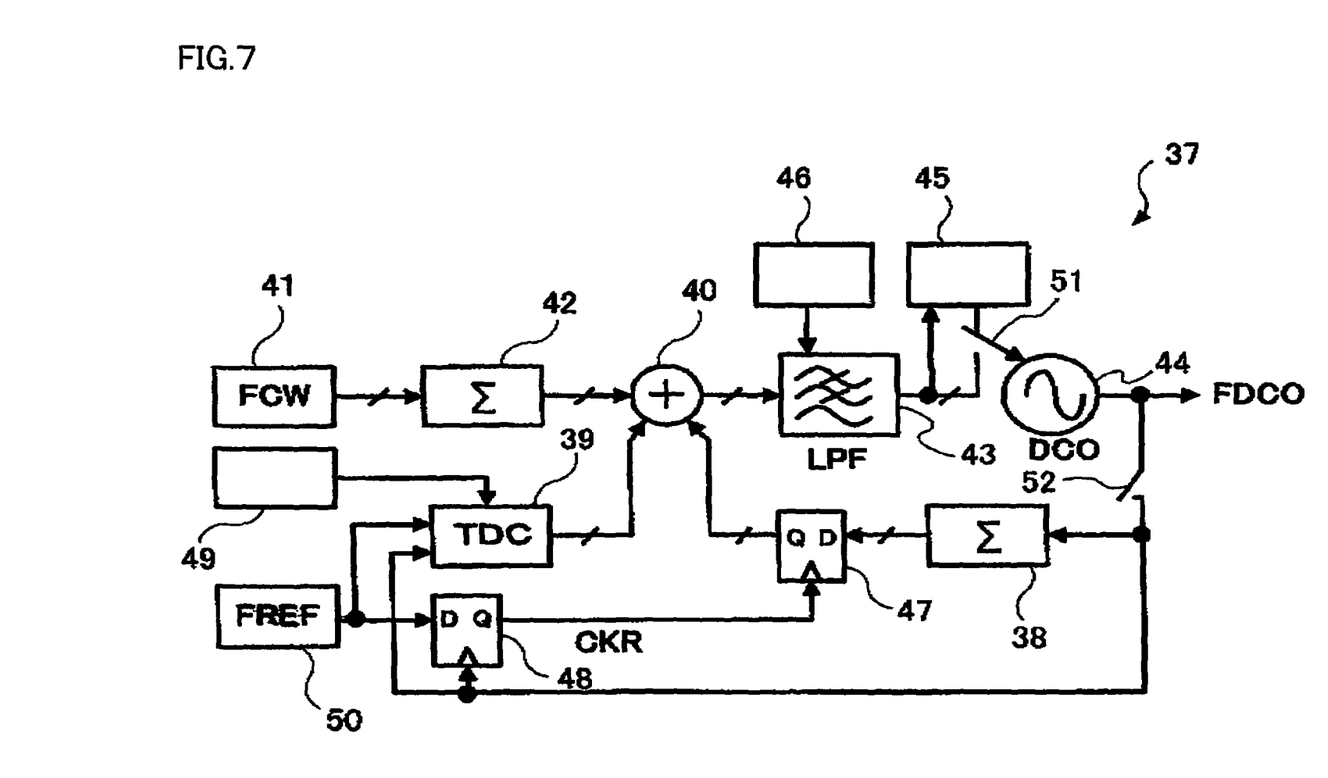
FIG. 7 is a diagram showing another embodiment of the local frequency generator of the radio apparatus 1.

FIG. 7 is a diagram showing another modified embodiment of the local frequency generator 21 of the radio apparatus 1. The local frequency generator 21 in FIG. 5 is constituted by an analog circuit, while the local frequency generator 37 shown in FIG. 7 is constituted by a digital circuit.

As shown in FIG. 7, the frequency generator 37 comprises an FCW generator 41 that generates a frequency command word FCW (frequency command word), a cumulative adder 42 that cumulatively adds the frequency command word FCW to output a frequency setting signal, an adder 40 that outputs a difference between a phase of a reference signal and a phase of a local oscillation signal of a digitally controlled oscillator DCO (digitally controlled oscillator) 44 as a phase error signal to a loop filter LFP 43, the loop filter LFP 43 that filters the phase error signal to output a control signal, and the digitally controlled oscillator DCO 44 that outputs a local oscillation signal FDCO based on the control signal.

The frequency generator 37 also comprises a cumulative adder 38 that detects a phase of the local oscillation signal FDCO, a sampler 47, an FREF generator 50 that generates a reference signal FREF, a retiming circuit 48 that performs retiming of the reference signal FREF by the FDCO to generate a clock CKR, and a time-to-digital converter TDC 39. The TDC is a time measuring device capable of digitally representing a phase difference between the output from the DCO 44 and the reference signal FREF with resolution higher than the sampler 47.

The frequency generator 37 comprises a resolution setting device 49 that sets a resolution of the TDC 39, a band setting device 46 that sets a band of the loop filter 4LFP 43, and a signal holder 45 that holds a control signal. In addition, the frequency generator 37 comprises a switch 51 to select a control signal held by the signal holder 45 or a control signal output by the LPF to be input to the DCO 44. The frequency generator 37 also comprises an ON/OFF switch 52 between the DCO 44 and the cumulative adder 38.

Figure 4:
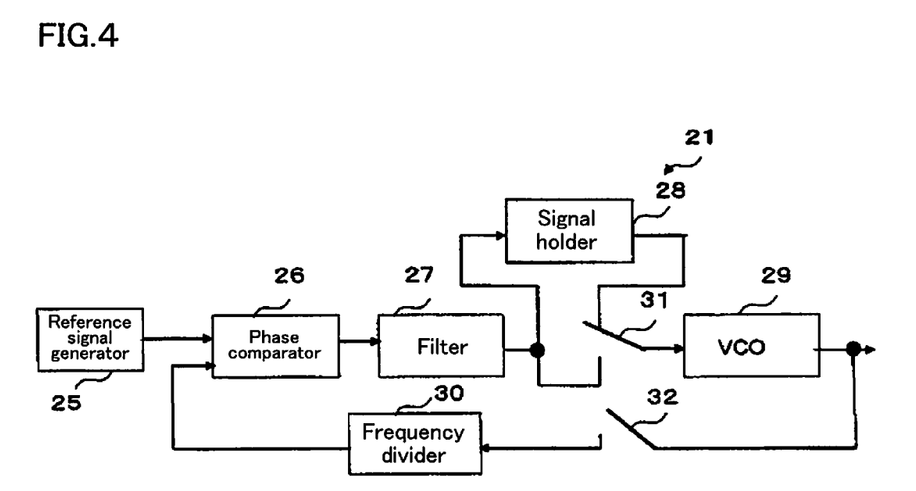
FIG. 4 is a diagram showing a local frequency generation circuit of the radio apparatus 1.

The following will describe counterparts between the local frequency generator 21 in FIG. 4 and the local frequency generator 37. The cumulative adder 38 corresponds to the frequency divider 30 in FIG. 4. The TDC 39 (time-to-digital converter) and the adder correspond to the phase comparator 26 in FIG. 4. The FCW signal generator 41 and the cumulative adder 42 correspond to the reference signal generator 25 in FIG. 4. The LPF 43 corresponds to the filter 27. The DCO 44 (digitally controlled oscillator) corresponds to the VCO (voltage controlled oscillator) 29. The signal holder 45 corresponds to the signal holder 28. Since the DCO 44 is digitally controlled, the signal holder 45 holds digital value as well. The resolution of the oscillation frequency of the DCO 44 can be 100 kHz or less. Detection of a PLCP preamble enables a radio signal to be detected.

That is, the local frequency generator 37 comprises the DCO 44 that generates a local oscillation signal based on a control signal, the TDC that compares a phase of the local oscillation signal and a phase of a reference signal to output a first comparison result, the sampler 47 that compares a phase of the local oscillation signal and the phase of the reference signal to output a second comparison result, the adder 40 that adds a frequency setting signal and the first and second comparison results to generate a phase error signal, the loop filter LFP 43 that filters the phase error signal to generate the control signal, the signal holder 28 that holds the control signal generated by the loop filter LFP 43, and a switch that supplies either the control signal generated by the loop filter LFP 43 or the control signal held by the signal holder 28 to the DC 44.

In addition, during the wait for a radio signal, the control unit 18 supplies the control signal held by the signal holder 45 to the DCO 44 and halts the TDC 39. When the detecting unit 17 detects a preamble, the control unit 18 controls the switch 51 to supply the control signal generated by the loop filter LFP 43 to the DCO 44.

The following will describe operations of the local frequency generator 37 in detail. For example, the control unit 18 firstly sets the frequency of the local frequency generator 37 when activating or shipping the radio apparatus 1. First, the control unit 18 controls the switch 51 and the ON/OFF switch 52 to connect the DCO 44 and LPF 43, thereby activating the local frequency generator 37. This enables the DCO 44 to generate a local oscillation signal with a desired frequency and the signal holder 45 to hold a control signal (the output value of the LPF 43) when the DCO 44 generates the local oscillation signal with the desired frequency.

After setting frequency, in a standby state, the control unit 18 switches the switch 51 to provide the control signal in the signal holder 45 to the DCO 44 and open the ON/OFF switch 52, thereby halting the cumulative adder 38, the TDC 39 and the adder 40, the LPF 43, and the like. At this time, the DCO 44 performs a free-running oscillation with the frequency set by the signal holder 45. Since the free-running oscillation causes frequency drift over time, the control signal held by the signal holder 45 is reset at a predetermined time. For resetting the control signal in the signal holder 45, the ON/OFF switch 52 is closed to activate the cumulative adder 38, the TDC 39, LPF 43 and the adder 40. In order to reduce the transient response in resetting, they may be operative in an open loop by several cycles with the previous value set by the signal holder 45 as an initial state, and the loop may be connected in stationary state.

Next, with reference to FIG. 8, operations of the TDC 39 will be described. The TDC 39 inputs an FDCO signal, which is an output signal of the DCO 44, into a plurality of inverters 53, to detect small differences from the reference clock FREF. The TDC 39 uses an inverter delay for measuring the time. A flip-flop 54 samples a signal inverter-delayed by the inverter 53 with the FREF, thereby outputting a difference between a rising of the FDCO and a rising of the FREF. And a detecting unit 59 (Pseudo-Thermometer-Code Edge Detector) detects and output the difference to the adder 40.

As described above, the local frequency generator can be constituted by a digital circuit as well.

In the example described above, the TDC is halted during standby time. However, the TDC 39 may not be halted. The TDC 39 is a block to determine the time resolution and determines the frequency accuracy. A frequency resolution necessary to detect a preamble is, for example, approximately 100 kHz. During standby time then, the time resolution of TDC 39 may be reduced instead of halting the TDC 39 using a control signal held by the signal holder 45.

Figure 8:
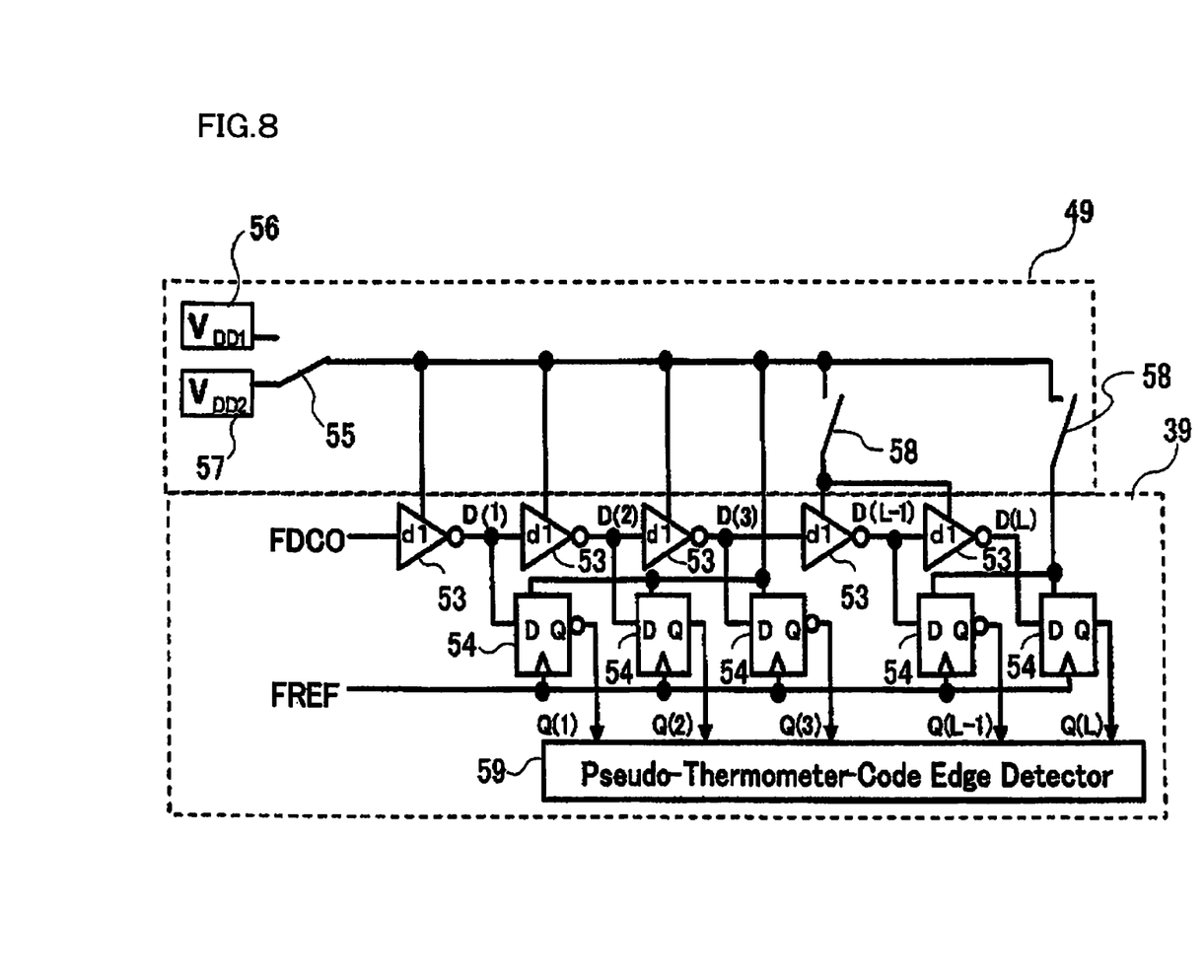
FIG. 8 is a block diagram showing the local frequency generator of FIG. 7 in detail.

Referring now to FIG. 8, the following will describe how to switch the time resolution of the TDC 39. The time resolution of the TDC 39 is switched by the resolution setting device 49. The resolution setting device 49 comprises a power supply 56, a power supply 57, and a switch 55. The power supply 56 supplies the voltage VDD1 and the power supply 57 supplies the voltage VDD2. The voltage VDD1 is smaller than the voltage VDD2. The switch 55 supplies either the voltage VDD1 or VDD2 to the inverter 53 at the direction of the control unit 18.

The resolution setting device 49 supplies the power supply VDD1 to the inverter 53 during the wait for a radio signal, and supplies the voltage VDD2 after detecting a preamble. The delay of inverter 53 becomes greater as the supplied voltage gets lower, and the time resolution reduces. In other words, the resolution of the TDC 39 gets higher when the resolution setting device 49 supplies the voltage VDD2 to the inverter 53 than when it supplies the voltage VDD1 to the inverter 53. That is, the TDC 39 outputs the phase comparison results with higher accuracy when the voltage VDD2 is supplied to the inverter 53.

One method for further reducing the time resolution of the TDC 39 is to reduce the number of inverter 53 operative during the wait for a radio signal. In this case, the number of operative inverter 53 and flip-flop 54 may be reduced. For example, during the wait for the radio signal, opening the ON/OFF switch 58 enables a part of the inverter 53 and a part of the flip-flop 54 to be halted.

The power consumption of the TDC 39 in the frequency converter 37 is large. Accordingly, reduction of the power consumption of the radio apparatus 1 is effective at least by reducing the time resolution of TDC 39.

When changing the time resolution of the TDC 39 as described above, the number of parts of the local frequency generator 37 can be reduced even without having the signal holder 45, the switch 51 and the ON/OFF switch 52.

When the LPF 43 implements the $\Delta\Sigma$ modulation to increase the time resolution, halting the $\Sigma$ modulation of the LPF 43 during standby time may reduce the power consumption of the local frequency generator 37.

For example, a wireless LAN is described as an example in the embodiments. However, such embodiments can be applied to any radio apparatus, the conditions of which changes according to the contents and time of a signal to be received.

While certain embodiments have been described, these embodiments have been presented by way of example only, and are not intended to limit the scope of the inventions. Indeed, the novel methods and systems described herein may be embodied in a variety of the other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A radio apparatus comprising:
   an antenna;
   an amplifier that amplifies a radio signal, received via the antenna, to generate an amplified signal;
   a first mixer that frequency converts the amplified signal to generate a first analog signal;
   a first A/D converter that converts the first analog signal to generate a first digital signal;
   a second mixer that frequency converts the amplified signal to generate a second analog signal;
   a second A/D converter that converts the second analog signal to generate a second digital signal;
   a demodulator that demodulates the first and second digital signals to generate a demodulated signal;
   a detector that detects a preamble from the first digital signal; and
   a controller that halts the second mixer and second A/D converter during the wait for the radio signal and activates the second mixer and second A/D converter when the detector detects the preamble;
   wherein the amplifier comprises a first transconductance circuit having a first transistor and a second transconductance circuit connected in parallel to the first transconductance circuit and having a second transistor and a third transistor, and
   wherein the controller halts the second transconductance circuit during the wait for the radio signal and activates the second transconductance circuit when the detector detects the preamble.

2. The radio apparatus as set forth in claim 1, further comprising a local frequency generator that generates and supplies a local oscillation signal to the first mixer and the second mixer,
   wherein the local frequency generator comprises:
      a voltage controlling oscillator that generates the local oscillation signal based on a control signal;
      a frequency divider that divides the local oscillation signal to generate a divided signal;
      a phase comparator that compares a phase of the divided signal and a phase of a reference signal;
      a filter that filters a comparison result of the phase comparator to generate the control signal;
      a signal holder that holds the control signal generated by the filter; and
      a switch that supplies either the control signal generated by the filter or the control signal held by the signal holder to the voltage controlling oscillator, and
   wherein the controller controls the switch to supply the control signal held by the signal holder to the voltage controlling oscillator during the wait for the radio signal and to supply the control signal generated by the filter to the voltage controlling oscillator when the detector detects the preamble.

3. The radio apparatus as set forth in claim 1, wherein the first transconductance circuit further includes a first inductor connected in series to the first transistor, the second transconductance circuit further includes a second inductor connected in series to the second transistor, and the third transistor is connected in series to the second inductor.

4. The radio apparatus as set forth in claim 3, wherein a proportion of a channel width of the first transistor to a channel width of the second transistor is 10:1.

5. The radio apparatus as set forth in claim 3, wherein an amount of current flowing in the first transistor is 10 times greater than an amount of current flowing in the second transistor.

6. The radio apparatus as set forth in claim 1, further comprising a local frequency generator that generates a local oscillation signal to supply the local oscillation signal to the first mixer and the second mixer,
   wherein the local frequency generator comprises:
      a digital controlling oscillator that generates the local oscillation signal according to a control signal;
      a TDC that compares a phase of the local oscillation signal and a phase of a reference signal to output a first comparison result;
      a sampler that compares the phase of the local oscillation signal and the phase of the reference signal to output a second comparison result;
      an adder that adds a frequency setting signal and the first and second comparison results to generate a phase error signal;
      a filter that filters the phase error signal to generate a control signal;
      a signal holder that holds the control signal generated by the filter; and
      a switch that supplies either the control signal generated by the filter or the control signal held by the signal holder to the digital controlling oscillator, and
   wherein the controller controls the switch to supply the control signal held by the signal holder to the digital controlling oscillator and to reduce a time resolution of the TDC during the wait for the radio signal, and to increase the time resolution of the TDC to supply the control signal generated by the filter to the digital controlling oscillator when the detector detects the preamble.

7. A radio apparatus comprising:
   an antenna;
   an amplifier that amplifies a radio signal, received via the antenna, to generate an amplified signal;
   a first mixer that frequency converts the amplified signal to generate a first analog signal;
   a first A/D converter that converts the first analog signal to generate a first digital signal;
   a second mixer that frequency converts the amplified signal to generate a second analog signal;
   a second A/D converter that converts the second analog signal to generate a second digital signal;
   a demodulator that demodulates the first and second digital signals to generate a demodulated signal;
   a detector that detects a preamble from the first digital signal;
   a controller that halts the second mixer and second A/D converter during the wait for the radio signal and activates the second mixer and second A/D converter when the detector detects the preamble; and
   a local frequency generator that generates and supplies a local oscillation signal to the first mixer and the second mixer;
   wherein the local frequency generator comprises:
      a voltage controlling oscillator that generates the local oscillation signal based on a control signal;

a frequency divider that divides the local oscillation signal to generate a divided signal;

a delta sigma modulator (DSM) applying ΔΣ modulation to the frequency divider;

a phase comparator that compares a phase of the divided signal and a phase of a reference signal;

a filter that filters a comparison result of the phase comparator to generate the control signal;

a signal holder that holds the control signal generated by the filter; and a switch that supplies either the control signal generated by the filter or the control signal held by the signal holder to the voltage controlling oscillator, wherein the controller controls the switch to supply the control signal held by the signal holder to the voltage controlling oscillator during the wait for the radio signal and to supply the control signal generated by the filter to the voltage controlling oscillator when the detector detects the preamble, and wherein the controller halts the DSM during the wait for the radio signal and activates the DSM when the detector detects the preamble.

8. A radio apparatus comprising:

an antenna;

an amplifier that amplifies a radio signal, received via the antenna, to generate an amplified signal;

a first mixer that frequency converts the amplified signal to generate a first analog signal;

a first A/D converter that converts the first analog signal to generate a first digital signal;

a second mixer that frequency converts the amplified signal to generate a second analog signal;

a second A/D converter that converts the second analog signal to generate a second digital signal;

a demodulator that demodulates the first and second digital signals to generate a demodulated signal;

a detector that detects a preamble from the first digital signal;

a controller that halts the second mixer and second A/D converter during the wait for the radio signal and activates the second mixer and second A/D converter when the detector detects the preamble; and a local frequency generator that generates a local oscillation signal to supply the local oscillation signal to the first mixer and the second mixer, wherein the local frequency generator comprises:

a digital controlling oscillator that generates the local oscillation signal according to a control signal;

a time-to-digital converter (TDC) that compares a phase of the local oscillation signal and a phase of a reference signal to output a first comparison result;

a sampler that compares the phase of the local oscillation signal and the phase of the reference signal to output a second comparison result;

an adder that adds a frequency setting signal and the first and second comparison results to generate a phase error signal;

a filter that filters the phase error signal to generate a control signal;

a signal holder that holds the control signal generated by the filter; and a switch that supplies either the control signal generated by the filter or the control signal held by the signal holder to the digital controlling oscillator, wherein the controller controls the switch to supply the control signal held by the signal holder to the digital controlling oscillator and to deactivate the TDC during the wait for the radio signal, and to activate the TDC to supply the control signal generated by the filter to the digital controlling oscillator when the detector detects the preamble.

* * * * *